United States Patent [19]

Goble

[11] 4,117,411
[45] Sep. 26, 1978

[54] ISOLATION CIRCUIT WITH DUTY CYCLE FEEDBACK

[75] Inventor: William M. Goble, Perkasie, Pa.
[73] Assignee: Moore Products Co., Spring House, Pa.
[21] Appl. No.: 836,661
[22] Filed: Sep. 26, 1977
[51] Int. Cl.² ............................................. H03F 3/38
[52] U.S. Cl. ................................. 330/10; 330/207 A; 330/251
[58] Field of Search .................... 330/10, 207 A, 251
[56] References Cited

U.S. PATENT DOCUMENTS

| 3,430,125 | 2/1969 | Povenmire et al. | 330/10 X |
|---|---|---|---|
| 3,976,955 | 8/1976 | Hamada | 330/207 A X |
| 4,050,028 | 9/1977 | Vosteen | 330/10 |

*Primary Examiner*—Lawrence J. Dahl
*Attorney, Agent, or Firm*—Zachary T. Wobensmith, 2nd; Zachary T. Wobensmith, III

[57] ABSTRACT

An isolation circuit with duty cycle feedback is disclosed which includes an operational amplifier with capacitive coupled negative feedback such that its output voltage varies to maintain its input terminals at the same potential, and which output is connected to the control terminal of a voltage controlled oscillator which generates a square wave voltage in which the ratio of ON time to the total period is directly related to the voltage from the operational amplifier. The output pulses of the voltage controlled oscillator are fed through a resistor to the negative input terminal of the operational amplifier. The output pulses from the oscillator are also fed through a driver transistor to control the input of an opto-coupler. The output from the opto-coupler passes through an amplifier to produce a square wave voltage with the same ON time ratio as the voltage controlled oscillator. The average value of this square wave voltage is obtained by a low pass filter and is directly proportional to the input analog voltage.

6 Claims, 1 Drawing Figure

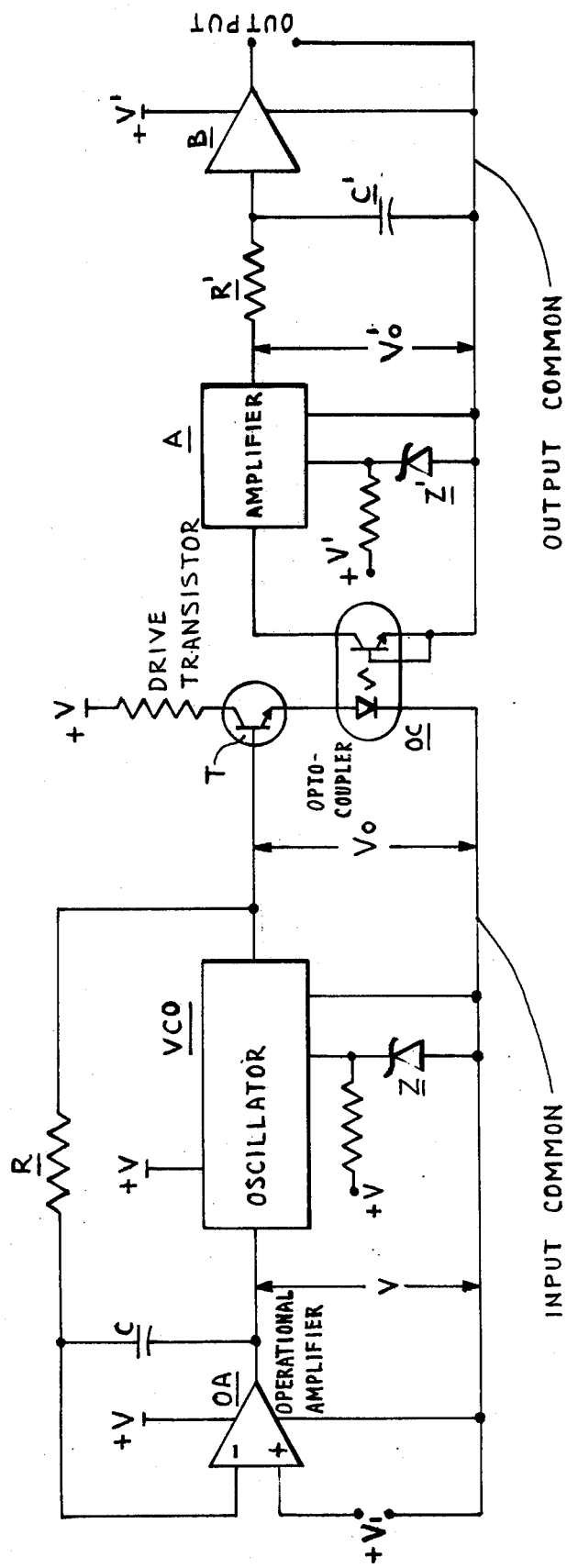

ISOLATION CIRCUIT WITH DUTY CYCLE FEEDBACK

BACKGROUND OF THE INVENTION

1. Field of the Invention

This invention relates to an isolator circuit with duty cycle feedback with synchronized input and isolated output circuits and with zener controlled amplitudes to maintain proportional average values.

2. Description of the Prior Art

In the utilization of analog electric signals for control purposes it is required on occasion to provide isolation between several devices utilizing the same signal so that the signal conductors may have common mode voltages that differ significantly in the several devices without affecting the value of the analog signal.

Heretofore, isolation has been provided by the procedure of transforming the analog signal to a proportional frequency of oscillation, transmitting the frequency through a non-conducting link such as an opto-coupler or transformer and finally transforming the frequency back to an analog signal. To achieve accuracy by this method requires a precisely controlled relationship, usually linear, between frequency and the analog signal for both transformations. Such precision is not easily obtained and is subject to degrading with aging of the apparatus.

The apparatus of my invention maintains the average values of the input and isolated output voltage in the face of circuit component variations caused by age and ambient conditions.

SUMMARY OF THE INVENTION

In accordance with the invention an isolation circuit with duty cycle feedback is provided which includes an operational amplifier connected to a voltage controlled oscillator which generates a square wave connected through a resistor to the operational amplifier, the output from the operational amplifier is connected to a driver transistor, connected to an opto-coupler which produces pulses electrically isolated from the input which are then fed through an amplifier to produce a square wave voltage with the same ON time ratio as the output of the voltage controlled oscillator, which is fed through a buffer and buffer amplifier to provide the output.

The principal object of the invention is to provide an isolation circuit with duty cycle feedback wherein the square wave voltage output and isolated input are synchronized with amplitudes maintaining the proportional average values therebetween.

A further object of the invention is to provide a circuit of the character aforesaid wherein the performance is reliable and not subject to degrading.

A further object of the invention is to provide a circuit of the character aforesaid which is simple and inexpensive to construct but of a long life.

Other objects and advantageous features of the invention will be more apparent from the description and claims.

DESCRIPTION OF THE DRAWING

The nature and characteristic features of the invention will be more readily understood from the following description taken in connection with the accompanying drawing forming part hereof, in which.

The FIGURE is a schematic view of the circuit of my invention.

It should, of course, be understood that the description and drawing herein are illustrative merely and that various modifications and changes can be made in the structure disclosed without departing from the spirit of the invention.

DESCRIPTION OF THE PREFERRED EMBODIMENT

Referring now more particularly to the drawing, a schematic diagram of an electric circuit is employed to illustrate the invention. An analog electric signal, which may be in the form of a voltage $V_1$, referred to a common input ground, is connected to the positive input terminal of an operational amplifier OA. The output of the amplifier OA is fed back to its negative input terminal through a capacitor C. When so connected, the operational amplifier OA will, within the limits of the available supply voltages, change its output V, as required, to maintain its two input terminals at the same potential.

The output of the operational amplifier OA is also connected to the control terminal of a voltage controlled oscillator VCO, which is made to generate a square wave voltage $V_o$, in which the ratio of ON time to the total period is directly related to the voltage V, applied to its control terminal. The output stage of the oscillator VCO is supplied with a constant voltage regulated by a zener diode Z so that the maximum value of the square wave is equal to the zener voltage and is independent of variations in the power supply or other circuit parameters. The minimum value of the square wave is zero, that is, equal to the input ground potential.

From the output of the voltage-controlled oscillator VCO, square wave pulses $V_o$ are fed through a resistor R, to the negative input terminal of the operational amplifier OA. When so connected, the output voltage V of the operational amplifier OA will be given by:

$$V = V_1 + \frac{1}{RC} \int (V_1 - V_o)\, dt,$$

where
 $V_1$ is voltage of the analog signal
 $V_o$ is the voltage of the square wave pulses
 $RC$ is a time constant determined by the values of resistor R and capacitor C The time constant RC is preferably made much larger than the period of oscillation of $V_o$ by a factor of at least 10 so that the oscillation frequency is greatly attenuated at V. The expression $\int (V_1 - V_o)\, dt$, when integrated over a full cycle of $V_o$ must be zero when V is in equilibrium, and this requires that the average value of $V_o$ be equal to $V_1$. Any other average value of $V_o$ will cause V to change, thereby adjusting the oscillator VCO ON time until equality is reached.

At this point it should be noted that a square wave voltage $V_o$ is generated which oscillates between zero and the zener-defined maximum and has an ON time ratio such that the average value is equal to the input analog voltage $V_1$. This square wave voltage $V_o$ is fed from the oscillator VCO through a driver transistor T, to control the input of an opto-coupler OC. When the input of the opto-coupler OC is energized, light emitted from its input diode causes the output transistor to conduct, so that pulses are produced in the output of the opto-coupler OC in synchronism with the square wave voltage $V_o$, but electrically isolated from it. To preserve the isolation, separate power supply sources $+V$ and $+V'$ and separate ground busses are employed for the input and output circuits respectively.

The pulses from the opto-coupler OC are passed through an amplifier A, which is supplied with a zener-controlled voltage to produce a second square wave voltage $V_o'$ which oscillates between zero and a zener-defined maximum determined by the zener-diode $Z'$ and has the same ON time ratio as $V_o$. The average value of the square wave voltage $V_o'$ is also directly proportional to the input analog voltage $V_1$ and the ratio is controlled only by the voltage ratio of the zener-diodes Z and $Z'$. The average value is obtained by use of filter $R'C'$, and then passed through a buffer amplifier B to the output.

Scaling, if required, may be readily accomplished with resistor networks (not shown) either in the input to the operational amplifier OA, or in the output buffer B.

Since the square wave voltages in both input and isolated output circuits are synchronized, and have zener-controlled amplitudes, their average values will remain proportional in spite of circuit-component variations with age and ambient conditions providing only that the zener diodes Z and $Z'$ retain constant voltage characteristics.

I claim:

1. An electric circuit for delivering an analog electric output signal proportional to and electrically isolated from an input analog voltage signal which comprises
   voltage controlled square wave generator means having an output terminal and a first input terminal and which delivers a first square wave voltage at said output terminal whose ratio of ON time to total period is directly related to the voltage applied to said first input terminal,
   said voltage controlled square wave generator means having a second input terminal,
   first regulating means connected to said second input terminal for controlling the maximum and minimum values of said first square wave voltage,
   comparator means connected to said output terminal of said square wave generator means and receiving the input analog voltage for determining the instantaneous difference between said input analog voltage and said first square wave voltage and generating a control voltage applied to said first input terminal of said square wave generator means which is proportional to the time integral of said difference,
   coupling means connected to said output terminal of said square wave generator means for synchronously transmitting said first square wave voltage to an electrically isolated circuit,
   said electrically isolated circuit comprising amplifier means having an output terminal and a first input terminal and which delivers at its said output terminal a second square wave voltage in synchronism with said first square wave voltage received at said first input terminal,
   said amplifier means having a second input terminal,
   second regulating means connected to said second input terminal of said amplifier for controlling the maximum and minimum values of said second square wave voltage, and
   averaging means for delivering an output signal of the average value of said regulated second square wave voltage.

2. An electric circuit as defined in claim 1 wherein said comparator means comprises an operational amplifier, a capacitor and a resistor, said operational amplifier having its negative input terminal connected through said capacitor to its own output and through said resistor to said output terminal of said square wave voltage generator.

3. An electric circuit as defined in claim 1 wherein said second input terminal of said square wave generator means is the supply voltage connection of said generator means, and
   said first regulating means includes a zener-regulated voltage supply for said second input terminal.

4. An electric circuit as defined in claim 1 in which said second input terminal of said amplifier means is the supply voltage connection for said amplifier means, and
   said second regulating means includes a zener-regulated voltage supply for said second input terminal.

5. An electric circuit as defined in claim 1 in which said coupling means is an opto-coupler.

6. An electric circuit as defined in claim 2 wherein the product of said resistor and said capacitor is a time period a plurality of times the period of said oscillation.

* * * * *